United States Patent
Buch

(10) Patent No.: US 10,277,228 B1
(45) Date of Patent: Apr. 30, 2019

(54) CONFIGURATION PIN-STRAPPING

(71) Applicant: Seagate Technology LLC, Cupertino, CA (US)

(72) Inventor: Bruce Douglas Buch, Westborough, MA (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 3 days.

(21) Appl. No.: 15/873,405

(22) Filed: Jan. 17, 2018

(51) Int. Cl.
H03K 19/173 (2006.01)
G01R 31/27 (2006.01)
G01R 27/14 (2006.01)
H03K 19/003 (2006.01)

(52) U.S. Cl.
CPC ......... *H03K 19/1732* (2013.01); *G01R 27/14* (2013.01); *G01R 31/275* (2013.01); *H03K 19/00315* (2013.01)

(58) Field of Classification Search
None
See application file for complete search history.

(56) References Cited

U.S. PATENT DOCUMENTS

| | | | |
|---|---|---|---|
| 3,935,476 A | 1/1976 | Paluck | |
| 5,175,859 A * | 12/1992 | Miller | G06F 12/0895 |
| | | | 326/38 |
| 5,777,488 A | 7/1998 | Dryer et al. | |
| 6,407,581 B1 | 6/2002 | Hull et al. | |
| 6,831,479 B2 | 12/2004 | Lo | |
| 6,937,028 B2 | 8/2005 | Tan | |
| 7,420,401 B2 | 9/2008 | MacDonald et al. | |
| 7,855,903 B2 * | 12/2010 | Khayat | H02M 1/32 |
| | | | 323/238 |
| 9,182,430 B2 | 11/2015 | Hertes | |
| 9,852,860 B2 * | 12/2017 | Hsiao | H01H 47/00 |
| 2018/0083636 A1 * | 3/2018 | Feng | H03K 5/1532 |

* cited by examiner

*Primary Examiner* — Minh D A
*Assistant Examiner* — James H Cho
(74) *Attorney, Agent, or Firm* — Westman, Champlin & Koehler, P.A.

(57) ABSTRACT

A chip configured with pin-strapping includes a configuration pin coupled to a resistor, the resistor coupled a configuration circuit configured to provide a threshold voltage at a sense time interval. A configuration vector may be determined by driving the configuration pin with high impedance, and sampling the configuration pin at sense time intervals such that the configuration vector corresponds to the time interval at which a threshold voltage is reached.

20 Claims, 7 Drawing Sheets

| Vector | R (Kohms) | C (pF) | min switch time (nS) | max switch time (nS) |
|---|---|---|---|---|
| 0 | 2.00 | (no cap: R tied to VDDIO) | | |
| 1 | 2.00 | 27 | 26 | 53 |
| 2 | 2.00 | 100 | 96 | 194 |
| 3 | 2.26 | 220 | 239 | 483 |
| 4 | 2.32 | 470 | 524 | 1060 |
| 5 | 2.32 | 1000 | 1115 | 2254 |
| 6 | 2.21 | 2200 | 2335 | 4725 |
| 7 | 2.00 | (no cap: R tied to ground) | | |

FIG. 7

| sense time # | aperture (nS) | sense time (nS) |
|---|---|---|
| 0 | | (right after hi-Z) |
| 1 | 43 | 75 |
| 2 | 45 | 217 |
| 3 | 41 | 504 |
| 4 | 55 | 1088 |
| 5 | 81 | 2295 |
| 6 | | 4745 |

FIG. 8

CONFIGURATION PIN-STRAPPING

SUMMARY

A chip configured by pin-strapping includes a configuration pin disposed on the chip, a resistor coupled to the configuration pin, and a configuration circuit coupled to the resistor. The configuration circuit may be configured to provide a threshold voltage when sampled at a sense time interval.

A method of configuring a chip by pin-strapping includes driving an external circuit through a configuration pin, monitoring a voltage of the configuration circuit at clocked time intervals, and determining a configuration vector by identifying the clocked time interval at which a threshold voltage has been reached.

An apparatus of the disclosure includes a chip having a configuration pin, an external resistor coupled to the configuration pin, a plurality of circuit traces coupled to the resistor, and a plurality of configuration circuits disposed on the circuit traces configured to program the chip with at least one of a plurality of configuration vectors.

This summary is not intended to describe each disclosed embodiment or every implementation of the pin-strapping configuration. Many other novel advantages, features, and relationships will become apparent as this description proceeds. The figures and the description that follow more particularly exemplify illustrative embodiments.

BRIEF DESCRIPTION OF THE DRAWINGS

FIGS. 7 and 8 are tables of exemplary values for configurations of the present disclosure.

DETAILED DESCRIPTION

The present disclosure describes a system and method of programming a chip. More specifically, the present disclosure describes programming a chip with a configuration vector through pin-strapping using a reduced number of configuration pins.

A configuration vector is a parameter that dictates how an integrated circuit functions. A configuration vector may be used to program a chip to enable features or provide different modes of operation. Such uses may include programming a chip ID, chip address, or mode settings for the chip. Many applications use I/O (input/output) pins on an integrated circuit to program configuration vectors. Integrated circuits commonly embed cores based on a system-on-chip (SoC) design.

For example, a package might include multiple instances of the same chip on a bus, and thus, each chip will have its own address on the bus. However, for various reasons, such as cost and convenience, a chip may be left programmable rather than permanently configured with a chip address. Therefore, a chip may be programmed with an address by pin-strapping an external circuit to the configuration pins on the chip.

Chip cost is related with chip size, and chips often include multiple pins, including configuration pins, which increase the size of a chip package. The number of pins not only impacts size and cost of a chip package, but may also increase the size and cost of a silicon die contained within the package when the die area is "pad-limited." A die is pad-limited when the area for accommodating I/O circuits and pads around its periphery for connections to the package pins is larger than the area used for the die's internal logic. I/O circuits and pads thus have structures with larger features and use more spacing than those of the internal logic. One method for reducing the cost of a chip is by reducing the number of pins in the package. Thus, instantiating the pins for programming multi-bit configuration vectors runs counter to cost reduction.

Many applications statically program configuration vectors by coupling external jumpers or resistors to $V_{DDIO}$ (the supply voltage of the I/O pin) or to a reference voltage (e.g., ground). With the 2-level sensing of digital I/O pins, configuring an SoC to one of N possible chip IDs uses ceiling ($\log_2 N$) pins. For example, three configuration pins are used for N number of chip IDs between five and eight.

Figure 1:
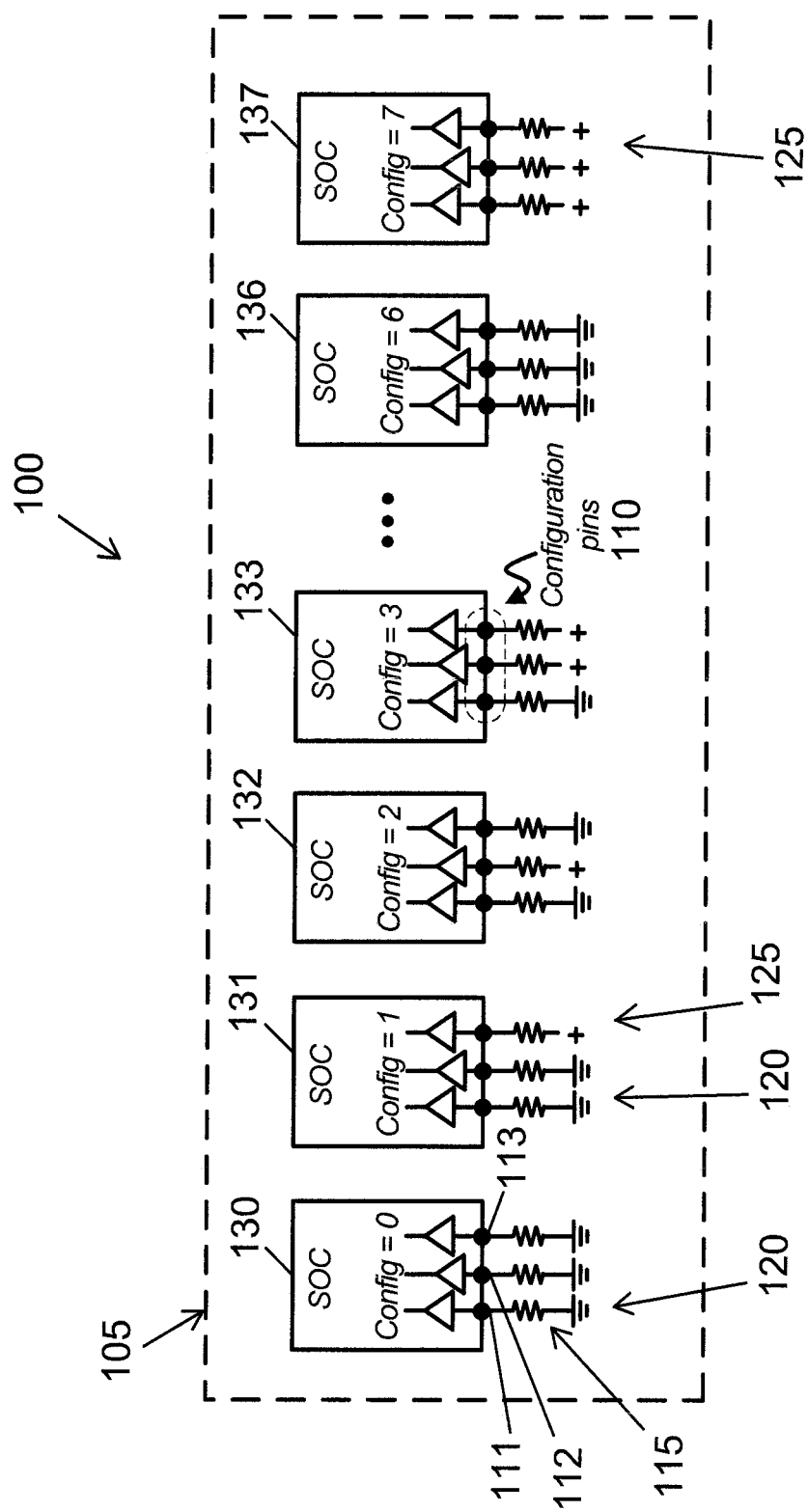
FIG. 1 illustrates a circuit schematic with a pin-strapping configuration.

FIG. 1 illustrates integrated circuits using configuration pin-strapping to program eight different 3-bit vectors. Configuration 100 includes up to eight SoC 105 configurations where an SoC 105 includes three configuration pins 110 connected to reference voltage 120 or supply voltage 125. The configuration vector is programmed by alternating which configuration pins 110 are connected to ground 120 or voltage 125. For example, SoC 130 with configuration=0 includes a pin 111 connected to a resistor 115, the resistor 115 further coupled to ground 120; pin 112 connected to a resistor 115, the resistor 115 further coupled to ground 120; and pin 113 connected to a resistor 115, the resistor 115 further coupled to ground 120.

An SoC 131 with configuration=1 includes configuration pins 110 with one pin coupled to voltage 125, such as pin 111 connected to resistor 115, the resistor 115 further coupled to ground 120; pin 112 connected to a resistor 115, the resistor 115 further coupled to ground 120; and pin 113 connected to a resistor 115, the resistor 115 further coupled to voltage 125. An SoC 132 with configuration=2 progresses similarly, and configuration 100 progresses through the possible variations of three pin configurations until completion. Thus, an SoC 136 with configuration=6 includes pin 111 connected to resistor 115, the resistor 115 further connected to voltage 125; pin 112 connected to resistor 115, the resistor 115 further connected to voltage 125; and pin 113 connected to resistor 115, the resistor 115 further connected to ground 120. An SoC 137 with configuration=7 includes configuration pins 110 coupled to voltage 125 through resistor 115.

The number of configuration pins used for pin-strapping may be reduced by using external resistor dividers to present multiple voltage levels to the configuration pins, but such measurement may further use pins with analog receivers and an on-chip A/D converter to resolve these levels. Embodiments of the present disclosure describe methods that allow multi-bit configuration vectors to be programmed using a single digital I/O pin with standard digital logic. Although the disclosure describes programming eight configuration vectors (equivalent to three bits) with a single pin, this is exemplary, and the method is applicable to any number of vectors using a reduced number of configuration pins.

Figures 2A, 2B:
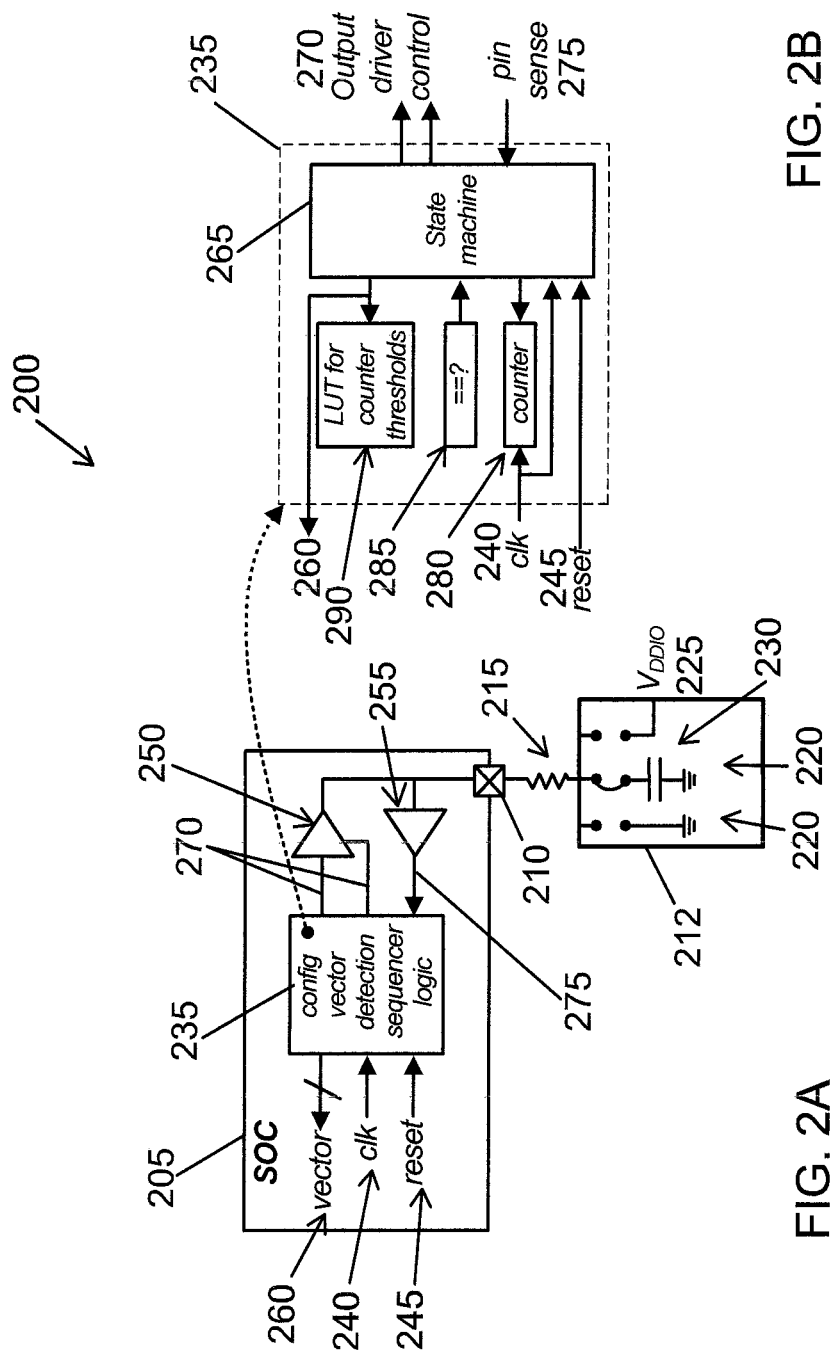
FIGS. 2A and 2B together illustrate a circuit schematic of a pin-strapping configuration of the present disclosure.

FIG. 2A illustrates an SoC with a single-pin configuration circuitry and logic. A system 200 of using a single pin to program a configuration vector includes an SoC 205 with a digital I/O pin, or configuration pin 210. The configuration pin 210 couples to an external resistor 215, the external resistor 215 may be coupled to a configuration circuit 212 which may couple resistor 215 to a reference voltage 220 (e.g., ground), supply voltage 225 (e.g., $V_{DDIO}$), or a capacitor 230 which is coupled to ground 220. Configuration pin 210 on SoC 205 is used to drive external capacitor 230 through the external resistor 215 and to read the digital voltage level on the configuration circuit 212 through the resistor 215. The SoC 205 includes configuration vector detection sequencer logic 235 which receives a clock input 240 and a reset input 245. SoC 205 further includes an output driver 250 and an input receiver 255 coupled between the logic 235 and configuration pin 210. Logic 235 determines the configuration vector and outputs vector 260.

FIG. 2B includes a further detailed illustration of logic 235. Clock input 240 is received by counter 280 and state machine 265. State machine 265 receives input from reset 245 and a decision logic 285. Logic 285 represents the time when counter 280 equals a counter threshold from lookup table (LUT) 290. State machine 265 further receives an input pin sense 275 from input receiver 255 coupled to configuration pin 210. State machine 265 further sends output drive control 270 through output driver 250 coupled to configuration pin 210. A LUT for counter thresholds 290 receives input from state machine 265 and sends output to decision logic 285. State machine 265 of logic 235 outputs vector 260.

SoC 205 determines the programmed vector 260 by driving the configuration pin 210 high, and sampling the configuration pin 210 at programmed time intervals to measure how long it takes the voltage at the far side of resistor 215 to exceed the switching threshold of the configuration pin 210. Thus, configuration vectors are defined by resistor 215 being coupled to ground 220, $V_{DDIO}$ 225, or a capacitor 230 coupled to ground 220. Logic 235 uses counter 280 to monitor voltage across the external resistor 215 at programmed intervals.

The time interval at which the voltage reading corresponds to a threshold voltage therefore corresponds to a programmed configuration vector 260 using values in the LUT 290. The values in LUT 290 determine the times (in clock periods) for the sample intervals corresponding to each configuration vector 260. The threshold voltage may be any logical voltage which logic 235 is configured to determine (e.g., a high voltage compared to the reference voltage), such that when a signal goes high compared to the reference voltage and is sensed 275, the LUT 290 has a sense time that corresponds with a configuration vector 260. For example, state machine 265 in logic 235 drives configuration pin 210 through output driver control 270, and receives input from clock input 240, and pin sense 275. State machine 265 samples configuration pin 210 at counted time intervals determined by clock input 240 and counter 280. When a threshold voltage is reached, such that decision logic 285 receives the time interval count from counter 280 equal to a counter threshold from the LUT 290, the state machine 265 outputs a configuration vector 260.

Figure 3:
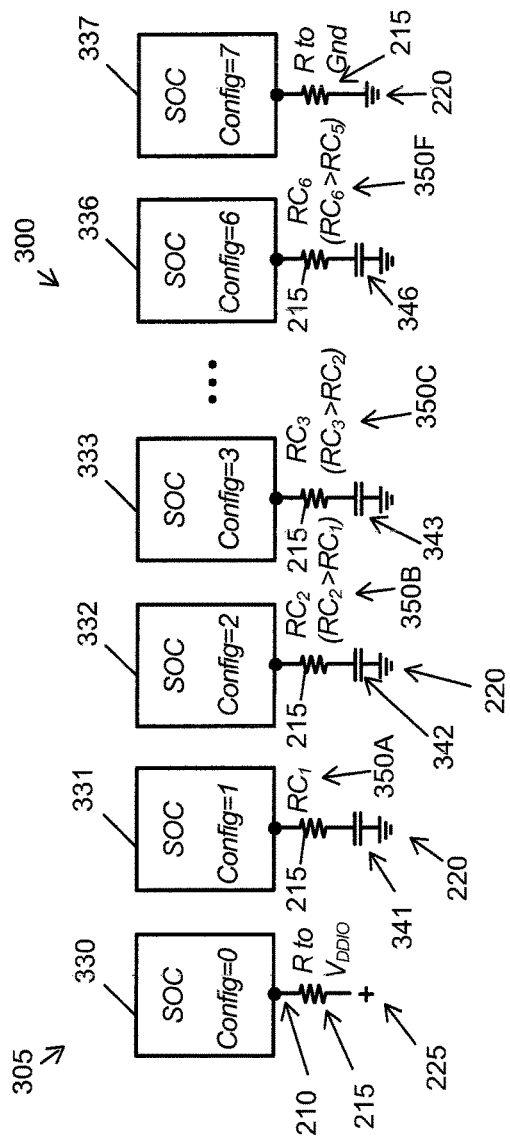
FIG. 3 illustrates an embodiment of a pin-strapping configuration of the present disclosure.

FIG. 3 illustrates integrated circuits with single-pin configuration strapping. A system 300 as described in the present disclosure includes an SoC 305 in eight different configurations. An SoC 330 with configuration=0 includes a configuration pin 210 coupled to external resistor 215, the external resistor coupled to I/O supply voltage 225 (e.g., $V_{DDIO}$). An SoC 331 with configuration=1 includes a configuration pin 210 coupled to external resistor 215, the external resistor coupled to a capacitor 341 to form an $RC_1$ (resistor capacitor) value 350A, and the capacitor 341 coupled to reference voltage 220 (e.g., ground). An SoC 332 with configuration=2 includes a configuration pin 210 coupled to external resistor 215, the external resistor coupled to a capacitor 342 to form an $RC_2$ value 350B, and the capacitor 342 coupled to ground 220. An SoC 333 with configuration=3 includes a configuration pin 210 coupled to external resistor 215, the external resistor coupled to a capacitor 343 to form an $RC_3$ value 350C, and the capacitor 343 coupled to ground 220.

System 300 progresses through the variations of one-pin configurations until completion. An SoC 336 with configuration=6 includes a configuration pin 210 coupled to external resistor 215, the external resistor coupled to a capacitor 346 to form an $RC_6$ value 350F, and the capacitor 346 coupled to ground 220. Finally, An SoC 337 with configuration=7 includes a configuration pin 210 coupled to external resistor 215, the external resistor coupled to ground 220. As illustrated in FIG. 3, SoC 332 includes an $RC_2$ value 350B greater than the $RC_1$ value 350A, and this progresses such that SoC 336 includes an $RC_6$ value 350F greater than an $RC_5$ value 350E (not shown) of an SoC 335 (not shown) with configuration=5.

A method of programming a configuration vector with a single pin includes sensing through an external resistor a configuration circuit, such as resistor 215 and capacitor 230 with a chosen RC value, to program configuration vectors between the minimal and maximal values received by coupling the resistor 215 to ground 220 or $V_{DDIO}$ 225. An SoC 305 uses a digital I/O pin, such as configuration pin 210, to drive the voltage high and sample the voltage across the resistor 215. When reset 245 is asserted, logic 235 drives the configuration pin 210 low for a period of time sufficient to discharge the largest possible RC value. When reset 245 is released, the configuration pin 210 is configured as an output and driven high, and counter 280, clocked by clock input 240, is started to mark out programmed intervals. When the counter 280 marks out programmed intervals, the configuration pin 210 is briefly configured as an input and sampled to determine if the input voltage has crossed the switching threshold.

The logic 235 monitors at programmed intervals how long it takes to charge the capacitor 230 to a logical "1" value through resistor 215. Thus, the time interval at which a sampled input first returns a logical "1" corresponds to a programmed configuration vector 260. If the external resistor 215 is coupled to $V_{DDIO}$ 225, the configuration pin 210 will immediately sample as a logical "1". If the external resistor 210 is coupled with a capacitor 230 to form an RC value, such as $RC_1$ value 350A, the configuration pin 210 will first sample as a logical "1" after one of the programmed sampling intervals. Thus, if the input samples as a logical "0", the configuration pin 210 reverts to an output and is driven high until the next sampling interval. Once the input samples as a logical "1", the configuration vector determination is complete, and the interval at which the input sampled as a logical "1" identifies the programmed vector. Finally, if the external resistor 215 is coupled to ground 220, the configuration pin 210 will remain low and not sample as a logical "1" after the last sampling interval. Thus, reading a logical "0" after the last possible sense time may correspond to the highest configuration vector, such as SoC 337 with configuration vector=7.

Figure 4:
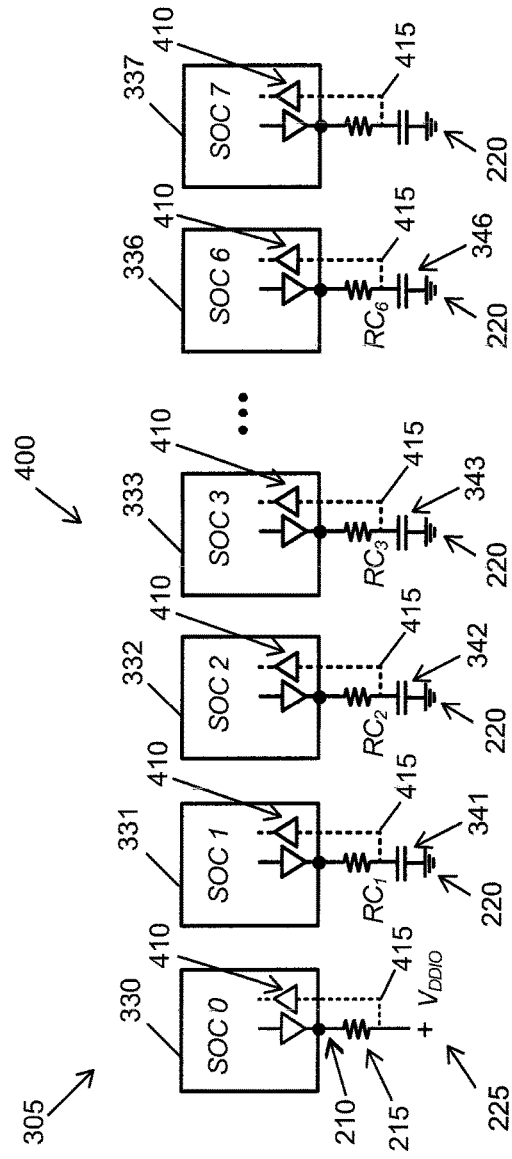
FIG. 4 illustrates a virtual receiver embodiment of the pin-strapping configuration of FIG. 3.

FIG. 4 illustrates an integrated circuit with a single-pin configuration acting as a virtual input receiver and includes components as described in FIGS. 2 and 3. Configuration pin 210 is bidirectional, and a system 400 with a configuration pin 210 is equivalent to having a virtual input receiver 410 in an SoC 305 sampling voltage at a connection 415 between the resistor 215 and other external components, such as a capacitor 341, ground 220, or $V_{DDIO}$ 225. Thus, when the resistor 215 impedance is low relative to the configuration pin 210 input impedance, briefly switching the configuration pin 210 to an input and checking the output at connection 415 is equivalent to having virtual input receiver 410 in SoC 305.

Figure 5:
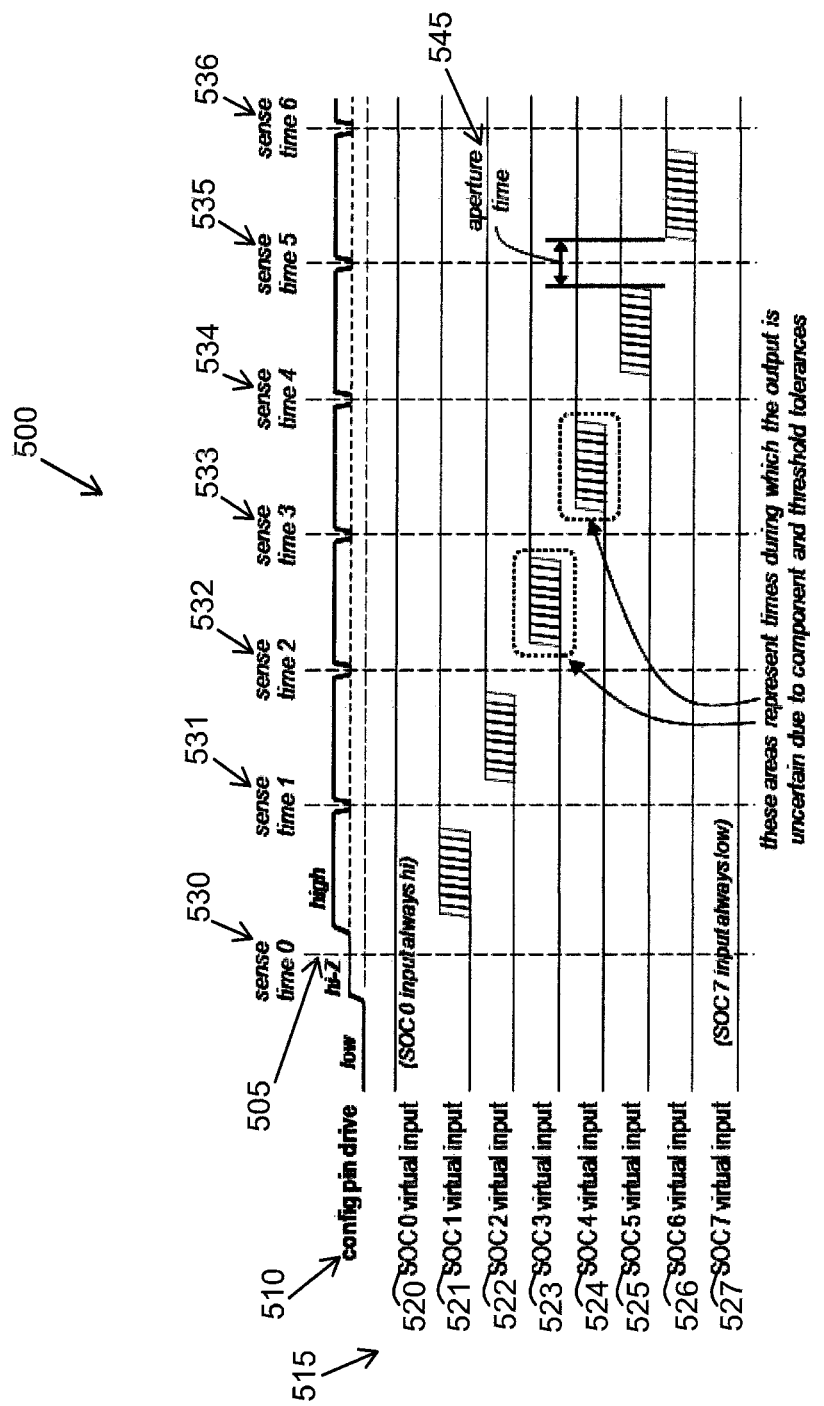
FIG. 5 is a chart of a configuration detection sequence of the present disclosure.

FIG. 5 is a chart of an SoC's virtual input receivers, such as virtual input receivers 410, at different sense times. Chart 500 includes SoC configurations 515 at different sense time intervals 505 as a configuration pin 510 is driven from low to high impedance (where hi-Z represents high impedance). Sense time intervals 540 lie midway between sense time intervals 505 as these are areas when the digital state of the configuration pin 510 may be uncertain due to the tolerances of components used to program the configuration vectors and switching threshold tolerances. An aperture time 545 corresponds with a sampled sense time and lies between the sense time intervals 540.

As seen in FIG. 5, sense time 0 (530) occurs before the smallest RC value would allow the configuration pin drive 510 to read as a logical "1". Therefore, SoC virtual input 520 reads as a logical "1" for a pin with a resistor coupled to $V_{DDIO}$ 225, such as for SoC 330. Sense time "N" occurs after the time that an RC value corresponding to the configuration vector N would result in the configuration pin reading as a logical "1", but while the RC value for vector N+1 would result in the pin still reading as a logical "0". Thus, if a configuration pin drive 510 first reads as a logical "1" at sense time N, the vector is N. If the configuration pin drive 510 still reads as a logical "0" after the last sense time, e.g., sense time 6 (536), the vector is N+1 (e.g., reading a logical "0" after sense time 6 (536) in this 8-vector example means the vector equals 7). As illustrated by FIG. 5, SoC 1 virtual input (521) increases during a sense time interval 540 after sense time 0 (530) and would read as a logical "1" at sense time 1 (531), and this would continue through SoC 2 virtual input (522) until SoC 6 virtual input (526) increased during a sense time interval 540 after sense time 5 (535) and would read as a logical "1" at sense time 6 (536). SoC 7 virtual input (527) will remain low and thus reads as a logical "0" after the last sense time (536) because it corresponds to similar SoC 337, wherein configuration pin 210 is coupled to ground 220 through resistor 215.

Figure 6:
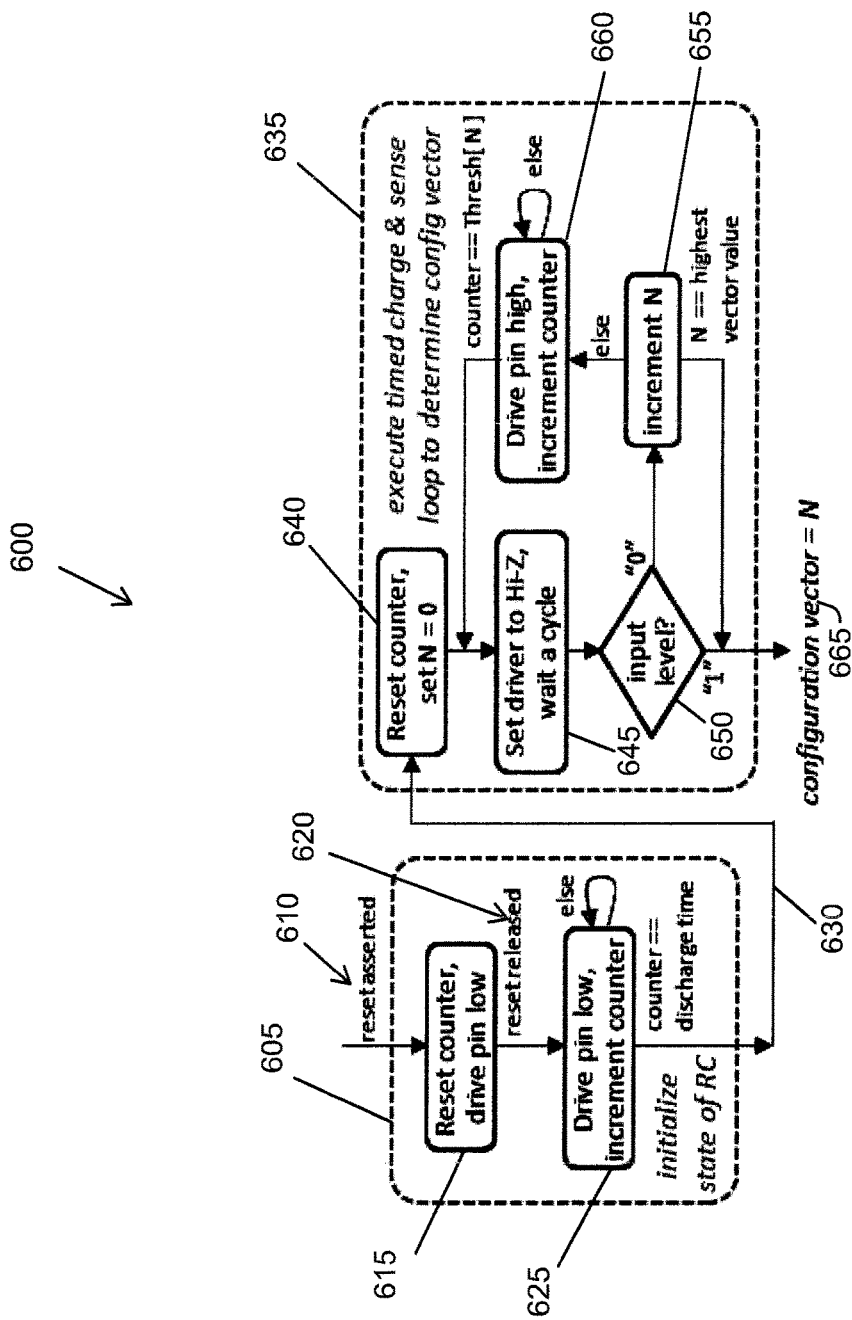
FIG. 6 is a simplified flow diagram of a configuration vector detection sequence.

FIG. 6 is a simplified flow diagram of a configuration vector detection sequence. Detection sequence 600 includes an RC initialization sequence 605 and a time sense loop 635 to determine a configuration vector 665 for "N" number of configuration vectors. RC initialization 605 starts with asserting reset 610 to reset counter 615 and drive a configuration pin low 625 for a period of time to insure the capacitor is fully discharged. Sense loop 635 may begin after reset 610 is released 620 with the configuration pin driven low 625 such that the counter equals the discharge time. Time sense loop 635 begins with block 640 where the counter is reset and sense time N equals 0. Next, block 645 sets the configuration pin to high impedance and waits until the next sense time at block 650 when the input level is checked. If block 650 reads a logical "1" with N=0, then the configuration vector equals zero, as discussed above, this occurs when a configuration pin is coupled to voltage, such as for SoC 330 with a resistor coupled to $V_{DDIO}$ 225. If block 650 reads a logical "0", N increases an increment 655. Next, block 660 includes driving the configuration pin high, incrementing the counter, and waiting until the counter increments to the value corresponding to the next sense time before returning to blocks 645, and subsequently to block 650 to sense the input level.

The logic moves to block 645 after the counter 660 has hit the sense time programmed in an LUT, such as LUT 290, and the counter 660 may be incremented thousands of times when executing time sense loop 635. Thus, the configuration vector is determined in one embodiment by the ordinality of the sense time iteration at which a logical "1" is sensed in sense time loop 635. For example, the configuration vector=0 if the input is a logical "1" the first time it is sensed, the configuration vector=1 if the input is a logical "1" the second time it is sensed, and the vector=N if the input is still a logical "0" the last time it is sensed. Therefore, a configuration vector is determined by identifying the clocked time interval at which a logical "1", e.g., a threshold voltage, has been reached.

RC components may be chosen to satisfy a desired aperture time, such as aperture time 545, which is the time between states of uncertainty during the charge-and-sense sequence for determining vectors. RC component selection may take into account several factors. Selection should provide enough distance between RC values used to program the configuration vector to withstand the sampling interval timing variability resulting from component and I/O circuit tolerances, such as the uncertainty of sense time intervals 540 of FIG. 5.

The selection method may include first selecting an aperture time 545 for the sampling intervals appropriate to the clock frequency and accuracy, and a first RC value to ensure that reading the configuration pin before charging begins, e.g., before sense time 0 (530), will result in a logical "0". The first RC value should result in a logical "0" at sense time 0 (530) when at lowest component tolerances and a lowest switching threshold. The R value is chosen in one embodiment to be low relative to the pin input impedance so that no drop is incurred when sensing the capacitor voltage, but high enough to enable use of small-valued capacitance C for practical charge-and-sense timing intervals, and to isolate the pin driver from the capacitance so that the pin can be used for general-purpose input/output functions (GPIO) after configuration vector detection is complete. Such GPIO functions may be limited to driving inputs with impedances sufficiently high enough to not interfere with the configuration vector sensing as described herein, and for which the pin toggling during the sensing sequence is limited, and to sensing outputs that are or can be disabled during the sensing sequence.

Second, to determine each next RC value, the end time of the uncertainty interval for the previous RC value is determined. The RC value is found by adding the aperture time to the latest time of switching to a logical "1" at maximum component and switching threshold tolerances. The RC value that results in switching to a logical "1" after charging time "t" is given by the following equation:

$$RC = -t * \ln(1 - V_T),$$

where $V_T$ is the switching threshold expressed as a fraction of $V_{DDIO}$.

Third, the second step is repeated until the RC values for a chosen number of configuration vectors and aperture times have been calculated. To program N number of vectors, (N−2) RCs are used.

FIG. 7 is a table providing examples of RC values calculated for an 8-vector system with a first and second switch time. FIG. 8 is a table providing examples of aperture times and sense times for sense time intervals resulting from component tolerances using known constraints. The constraints include 1% resistor tolerance with standard 1% resistor values for resistances between 2 KΩ and 2.4 KΩ, standard 5% capacitor tolerance values, a switching threshold between 40% and 60% of $V_{DDIO}$, and an aperture time of 40 ns.

A system for programming configuration vectors may use fixed or modifiable pin-strapping. In one embodiment, a product may use a chip capable of multiple modes of operation that is to be programmed with a particular mode for a particular product. In such a case, a selected resistor and capacitor may be permanently coupled, such as by soldering, on a product's printed circuit board and pin-strapped to a configuration pin of the selected chip. A product using multiple instances of a chip that are distinguished from each other by a board-programmed address might have pin-strapped resistors and capacitors soldered on for each chip. Thus, each chip would have a different RC value to correspond to an individual configuration vector, such as an individual chip address on a bus.

Figure 9:
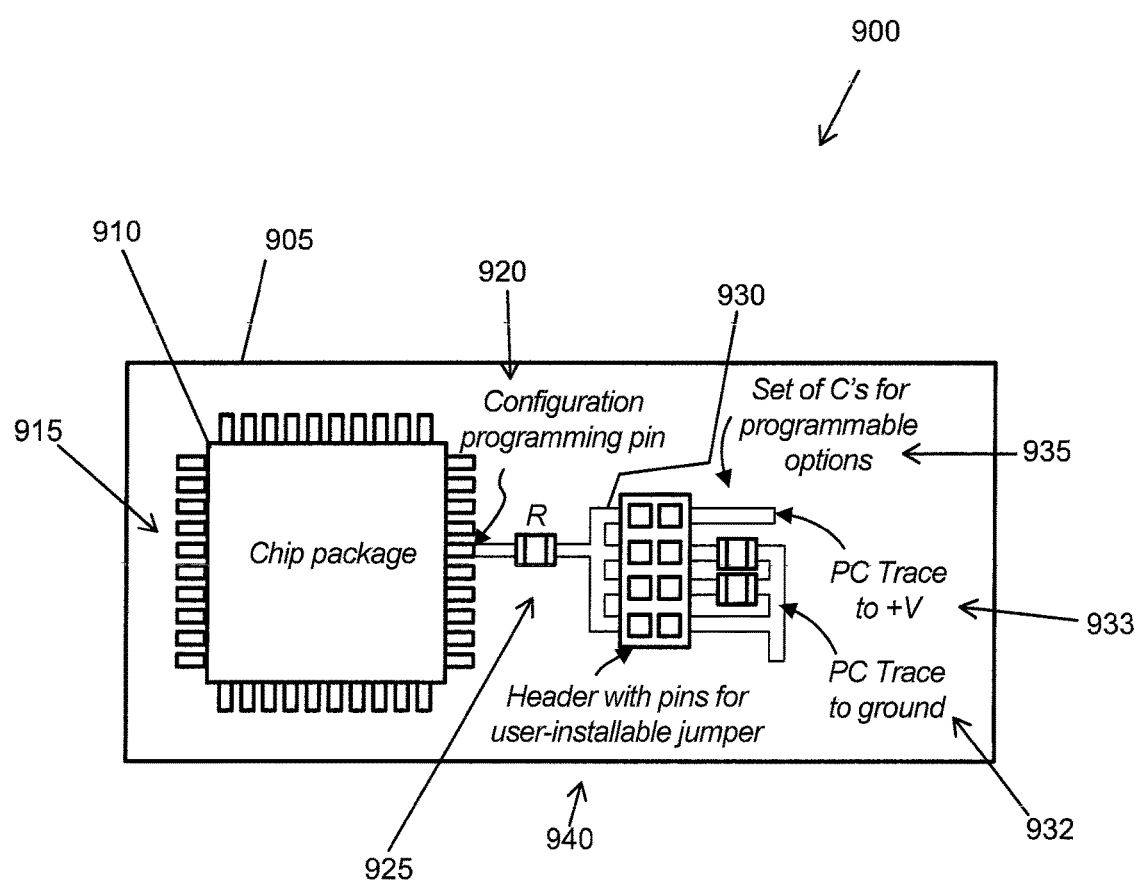
FIG. 9 is an alternative embodiment of the present disclosure.

In another embodiment of the present disclosure, a product may use a chip that remains modifiable. For example, a product may provide a chip with field-programmable modes or addresses. FIG. 9 illustrates a schematic diagram of a system 900 with a field-programmable chip using a single configuration pin. System 900 for a field-programmable product includes a chip 910 with a plurality of circuit pads 915 on a circuit board 905. The plurality of circuit pads 915 of chip 910 include a configuration pin 920 connected to an external resistor 925. External resistor 925 is further coupled to a plurality of printed circuit (PC) traces 930 which includes a PC trace connected to a supply voltage 933 (e.g., $V_{DDIO}$) and a PC trace connected to a reference voltage 932 (e.g., ground). Disposed on the plurality of PC traces 930 are a plurality of capacitors 935 with different values. A header 940 may be selectively coupled to the plurality of PC traces 930 to make board connections via user-installable jumpers.

Header 940 contains jumpers to couple with PC traces 930 and connect one or more of the plurality of capacitors 935 on board 905 with resistor 925 and configuration pin 920. Header 940 may contain different configurations of jumpers to couple resistor 925 with different capacitors to enable various configuration vectors. Alternatively, header 940 may be configured to couple resistor 925 to ground 932 or supply voltage 933. For example, header 940 may be configured to couple resistor 925 directly to ground 932 to correspond to a low input, such as with SoC 337 with configuration vector=7. Header 940 may also be configured to couple resistor 925 directly to supply voltage 933 to correspond with a high input, such as with SoC 330 with configuration vector=0. Thus, header 940 allows chip 910 to be programmed with various user-selectable modes or addresses without permanently pin-strapping a configuration vector to a chip.

Although examples of the disclosure discuss using a single pin to program an SoC with eight configuration vectors. One skilled in the art will recognize that the methods and systems described may be used on a variety of chip structures that use pin-strapping and a plurality of pins may be used to program a plurality of configuration vectors. A chip may use pin-strapping as disclosed to reduce the number of configuration pins used for programming in a variety of applications. Thus, this disclosure is illustrative and changes may be made in detail in matters of structure, arrangement, and method without departing from the scope of the present disclosure.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and therefore are not drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A pin-strapped chip, comprising:
a sense time interval counter;
a configuration pin disposed on the chip;
a resistor coupled to the configuration pin; and
a configuration circuit coupled to the resistor, wherein the configuration circuit is configured to provide a threshold voltage at a corresponding sense time interval.

2. The pin-strapped chip of claim 1, wherein the configuration circuit coupled to the resistor includes a connection to a reference voltage.

3. The pin-strapped chip of claim 1, wherein the configuration circuit coupled to the resistor includes a connection to a supply voltage.

4. The pin-strapped chip of claim 1, wherein the configuration circuit coupled to the resistor includes at least one capacitor coupled in series with the resistor to a reference voltage.

5. The pin-strapped chip of claim 1, wherein the configuration pin is bidirectional.

6. A method of configuring a chip, comprising:
   driving an external configuration circuit through a configuration pin;
   monitoring a voltage of the external configuration circuit at a clocked time interval; and
   determining a configuration vector by identifying the clocked time interval at which a threshold voltage has been reached.

7. The method of claim 6, wherein the configuration vector is determined by coupling the external configuration circuit to a reference voltage.

8. The method of claim 6, wherein the configuration vector is determined by coupling the external configuration circuit to a supply voltage.

9. The method of claim 6, wherein the configuration vector is determined by coupling the external configuration circuit to at least one of a plurality of capacitors coupled to a reference voltage.

10. The method of claim 6, wherein the configuration vector programs a chip address.

11. The method of claim 6, and further comprising first asserting a reset on the chip.

12. The method of claim 11, and further comprising driving a configuration pin low to discharge the external configuration circuit upon asserting the reset on the chip.

13. The method of claim 12, and further comprising asserting a counter on the chip prior to driving the external configuration circuit high through the configuration pin.

14. The method of claim 13, wherein monitoring the voltage of the external configuration circuit further comprises incrementing the counter and sampling the configuration pin at the clocked time interval until a return high is determined.

15. The method of claim 14, and further comprising using a lookup table on the chip with programmed sense times to identify the clocked time interval.

16. An apparatus, comprising:
   a chip having a sense time interval counter coupled to a configuration pin;
   an external resistor coupled to the configuration pin;
   a plurality of circuit traces coupled to the resistor; and
   a plurality of configuration circuits disposed on the circuit traces configured to program at least one of a plurality of configuration vectors corresponding to sensed time intervals.

17. The apparatus of claim 16, wherein at least one of the plurality of configuration circuits includes a connection to a reference voltage.

18. The apparatus of claim 16, wherein at least one of the plurality of configuration circuits includes a connection to a supply voltage.

19. The apparatus of claim 16, wherein at least one of the plurality of configuration circuits includes a capacitor coupled to a reference voltage.

20. The apparatus of claim 16, and further comprising a header configured to selectively couple at least one of the plurality of configuration circuits to the external resistor.

* * * * *